US010146071B2

(12) United States Patent
Han et al.

(10) Patent No.: US 10,146,071 B2
(45) Date of Patent: Dec. 4, 2018

(54) OPTICAL TRANSMITTER MODULE

(71) Applicant: Electronics and Telecommunications Research Institute, Daejeon (KR)

(72) Inventors: Young-Tak Han, Daejeon (KR); Sang Ho Park, Daejeon (KR); Yongsoon Baek, Daejeon (KR); Jang Uk Shin, Daejeon (KR); Dong Hyo Lee, Daejeon (KR); Dong-Hun Lee, Sejong-si (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 36 days.

(21) Appl. No.: 15/596,566

(22) Filed: May 16, 2017

(65) Prior Publication Data
US 2018/0143463 A1 May 24, 2018

(30) Foreign Application Priority Data

Nov. 22, 2016 (KR) .......................... 10-2016-0156038

(51) Int. Cl.
*G02F 1/025* (2006.01)
*H01L 23/00* (2006.01)
*G02F 1/015* (2006.01)

(52) U.S. Cl.
CPC .............. *G02F 1/025* (2013.01); *H01L 24/49* (2013.01); *G02F 2001/0157* (2013.01); *G02F 2201/58* (2013.01); *H01L 2224/4912* (2013.01)

(58) Field of Classification Search
CPC ............. G02F 1/025; G02F 2001/0157; G02F 2201/58; H01L 24/49; H01L 2224/4912
See application file for complete search history.

(56) References Cited

U.S. PATENT DOCUMENTS

| 4,811,082 A | * | 3/1989 | Jacobs | .................. | H01L 23/538 |
| | | | | | 174/261 |
| 5,394,489 A | * | 2/1995 | Koch | .................. | G02B 6/12004 |
| | | | | | 257/E27.128 |
| 5,500,758 A | * | 3/1996 | Thompson | ........... | H04B 10/504 |
| | | | | | 348/E7.094 |
| 5,696,466 A | * | 12/1997 | Li | .......................... | H01L 23/66 |
| | | | | | 330/286 |

(Continued)

OTHER PUBLICATIONS

Kanazawa et al, A Compact EASDFB Laser Array Module for a Future 100-Gb/s Ethernet Transceiver, IEEE Journal of Selected Topics in Quantum Electronics, V. 17, N. 5, 2011.*

(Continued)

*Primary Examiner* — Peter Radkowski
(74) *Attorney, Agent, or Firm* — Rabin & Berdo, P.C.

(57) ABSTRACT

Provided is an optical transmitter module. The optical transmitter module includes a substrate, a ground layer disposed on the substrate, an electro-absorption modulated laser (EML) chip disposed on the ground layer to generate an modulated optical signal, a ground structure disposed on the EML chip and electrically connected to the ground layer, a matching resistor disposed on the ground structure, and a first bonding wire disposed between the EML chip and the matching resistor to electrically connect the EML chip to the matching resistor.

17 Claims, 8 Drawing Sheets

(56) References Cited

U.S. PATENT DOCUMENTS

| | | | | |
|---|---|---|---|---|
| 6,127,894 | A * | 10/2000 | Alderton | H01L 23/66 330/286 |
| 6,424,223 | B1 * | 7/2002 | Wang | H01L 23/66 330/286 |
| 6,804,444 | B2 * | 10/2004 | Shin | G02B 6/12004 385/131 |
| 6,922,278 | B2 * | 7/2005 | Vail | H01S 5/0265 359/320 |
| 7,012,941 | B2 * | 3/2006 | Park | H01S 5/02276 372/29.01 |
| 8,111,521 | B2 * | 2/2012 | Kamgaing | H01P 1/212 361/720 |
| 8,344,828 | B2 | 1/2013 | Lee et al. | |
| 8,804,366 | B2 * | 8/2014 | Kamgaing | H01P 1/212 361/748 |
| 8,805,129 | B2 * | 8/2014 | Han | G02B 6/423 385/129 |
| 9,335,474 | B2 * | 5/2016 | Han | G02B 6/423 |
| 2001/0043384 | A1 * | 11/2001 | Ishizaka | H01S 5/12 359/248 |
| 2002/0097094 | A1 * | 7/2002 | Wang | H01L 23/66 330/286 |
| 2002/0183002 | A1 * | 12/2002 | Vail | H01S 5/0265 455/10 |
| 2003/0190108 | A1 * | 10/2003 | Shin | G02B 6/12004 385/14 |
| 2003/0231675 | A1 * | 12/2003 | Park | H01S 5/02276 372/38.1 |
| 2009/0039986 | A1 * | 2/2009 | Kamgaing | H01P 1/212 333/24 C |
| 2010/0135619 | A1 * | 6/2010 | Choi | G02B 6/12007 385/88 |
| 2011/0085760 | A1 * | 4/2011 | Han | G02B 6/423 385/14 |
| 2012/0092076 | A1 * | 4/2012 | Kamgaing | H01P 1/212 330/302 |
| 2013/0148975 | A1 * | 6/2013 | Kwon | H04B 10/2575 398/116 |
| 2014/0302623 | A1 * | 10/2014 | Han | G02B 6/423 438/25 |

OTHER PUBLICATIONS

Kanazawa et al., Ultra-Compact 100 GbE Transmitter Optical Sub-Assembly for 40-km SMF Transmission, J. Lightwave Technology, V. 31, N. 4, 2013.*

Yao et al., Performance Degradation of Integrated Optical Modulators Due to Electrical Crosstalk, J. Lightwave Technology, V. 34, N. 13, 2016 (Jul.).*

Zhang et al, A3D RF IOmpedance matching Circuit Used to Package of Multi-Channel Parallel EML Array, 2015 14th International Conference on Optical Communications and Networks (COCN).*

Fujisawa et al., 4x25-Gbit/s, Monolithically Integrated Light Source for 100-Gbit/s Ethernet, ECOC 2010.*

Marek Chaciński et al., "ETDM Transmitter Module for 100-Gb/s Ethernet", IEEE Photonics Technology Letters, vol. 22, No. 2, pp. 70-72, Jan. 15, 2010.

Marek Chacinski et al., "Monolithically Integrated DFB-EA for 100 Gb/s Ethernet", IEEE Electron Device Letters, vol. 29, No. 12, pp. 1312-1314, Dec. 2008.

Takaharu Ohyama et al., "Compact Hybrid Integrated 100 Gbit/s Transmitter Optical Sub-assembly Using Optical Butt-coupling between EADFB Lasers and Silica-based AWG Multiplexer",IEEE Journal of Lightwave Technology, pp. 1-9, 2015.

* cited by examiner

OPTICAL TRANSMITTER MODULE

CROSS-REFERENCE TO RELATED APPLICATIONS

This U.S. non-provisional patent application claims priority under 35 U.S.C. § 119 of Korean Patent Application No. 10-2016-0156038, filed on Nov. 22, 2016, the entire contents of which are hereby incorporated by reference.

BACKGROUND

The present disclosure herein relates to an optical transmitter module, and more particularly, to an optical transmitter module having improved high-frequency characteristics.

In recent years, technologies using optical transmission are being used as technologies for providing service to subscribers using base station of the telecommunication office. An optical transmitter module provides an optical signal used in the optical transmission. In the optical transmitter module, fast signal modulation is required for transmitting a lot of data. In order to satisfy performance with respect to the modulation speed, an electro-absorption modulated laser (EML) may be used in the optical transmitter module.

A continuous wave (CW) that is emitted from a light source of the EML is modulated through a high-frequency signal that is transmitted through a transmission line. That is, in order to improve the speed of the optical transmitter module, a modulation bandwidth of the optical transmitter has to be expanded to a high frequency range.

SUMMARY

The present disclosure provides an optical transmitter module having improved high-frequency characteristics.

The present disclosure also provides an optical transmitter module that is improved in uniformity of high-frequency characteristics.

However, objects of the inventive concept are not limited to the abovementioned objects.

An embodiment of the inventive concept provides an optical transmitter module including: a substrate; a ground layer disposed on the substrate; an electro-absorption modulated laser (EML) chip disposed on the ground layer to generate an optical signal; a ground structure disposed on the EML chip and electrically connected to the ground layer; a impedance matching resistor disposed on the ground structure; and a first bonding wire disposed between the EML chip and the matching resistor to electrically connect the EML chip to the matching resistor.

In an embodiment, the optical transmitter module may further include: a capacitor disposed on the ground structure and electrically connected to the ground structure; and a second bonding wire disposed between the capacitor and the matching resistor to electrically connect the capacitor to the matching resistor, wherein the capacitor may block a direct current (DC) flowing through the matching resistor.

In an embodiment, the ground structure may include: a ground plate spaced apart from the EML chip; and a pair of supports disposed between the ground plate and the ground layer, where in the ground plate may be electrically connected to the ground layer.

In an embodiment, the ground plate may include first and second ends, which face each other in a first direction parallel to a top surface of the substrate, in viewpoint of a plane, the EML chip may be disposed between the first and second ends of the ground plate, and the pair of supports may be respectively disposed between the first end of the ground plate and the ground layer and between the second end of the ground plate and the ground layer.

In an embodiment, the optical transmitter module may further include a planar light-wave circuit chip (PLC) disposed parallel to the substrate, wherein the ground plate may include third and fourth ends, which are parallel to the top surface of the substrate and face each other in a second direction crossing the first direction, the third end of the ground plate may vertically overlap the substrate, and the fourth end of the ground plate may vertically overlap the PLC.

In an embodiment, in the viewpoint of the plane, the fourth end may protrude from each of the pair of supports in the second direction.

In an embodiment, the ground plate may include Cu, W, CuW, SUS, or a combination thereof, and a surface of the ground plate may be coated with Cr/Au, Cr/Ni/Au, Ni/Pd/Au, or Ti/Pt/Au.

In an embodiment, the ground plate may include a conductive layer and a dielectric layer disposed between the conductive layer and the pair of supports, and the conductive layer may be electrically connected to the ground layer.

In an embodiment, the optical transmitter module may further include a third bonding wire disposed between the conductive layer and the ground layer to electrically connect the conductive layer to the ground layer.

In an embodiment, each of the pair of supports may include a conductive material, and the ground plate and the ground layer may be electrically connected to each other through the pair of supports.

In an embodiment, the optical transmitter module may further include a third bonding wire disposed between the ground plate and the ground layer to electrically connect the ground plate to the ground layer, and wherein each of the pair of supports may include a dielectric material.

In an embodiment, the matching resistor and the capacitor may be a surface-mount device (SMD)-type resistor and an SMD-type capacitor, respectively.

In an embodiment, the EML chip may include: a distributed feedback (DFB) light source configured to generate continuous wave (CW) light; an EAM configured to modulate the CW light from the light source and generate the modulated optical signal; a high-frequency transmission line configured to transmit a high-frequency signal inputted into the EAM and a high-frequency signal outputted from the EAM; and input and output terminal electrodes respectively disposed on both ends of the high-frequency transmission line, wherein, in viewpoint of a plane, the ground plate may be spaced apart from the output terminal electrode, and the matching resistor may not only match the impedance between the high-frequency transmission line and the EAM to nearly 50 ohm.

In an embodiment, the high-frequency transmission line may include: a first high-frequency transmission line disposed between the input terminal electrode and the EAM electrode; and a second high-frequency transmission line disposed between the EAM electrode and the output terminal electrode, wherein each of the first and second high-frequency transmission lines may include a traveling wave microstrip line.

In an embodiment of the inventive concept, an optical transmitter module includes: a substrate; a ground layer disposed on the substrate; a multi-channel EML array chip disposed on the ground layer to generate an optical signal; a ground structure disposed on the multi-channel EML array chip and electrically connected to the ground layer; a plurality of matching resistors disposed on the ground structure; a plurality of first bonding wires disposed between the multi-channel EML array chip and the plurality of matching resistors to electrically connect the channels of the multi-channel EML array chip to the plurality of matching resistors, respectively; a plurality of capacitors disposed on the ground structure and electrically connected to the ground structure; and a plurality of second bonding wires disposed between the plurality of capacitors and the plurality of matching resistors to electrically connect the plurality of capacitors to the plurality of matching resistors, respectively.

In an embodiment, the plurality of first bonding wires may have the same length.

In an embodiment, the plurality of second bonding wires may have the same length.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
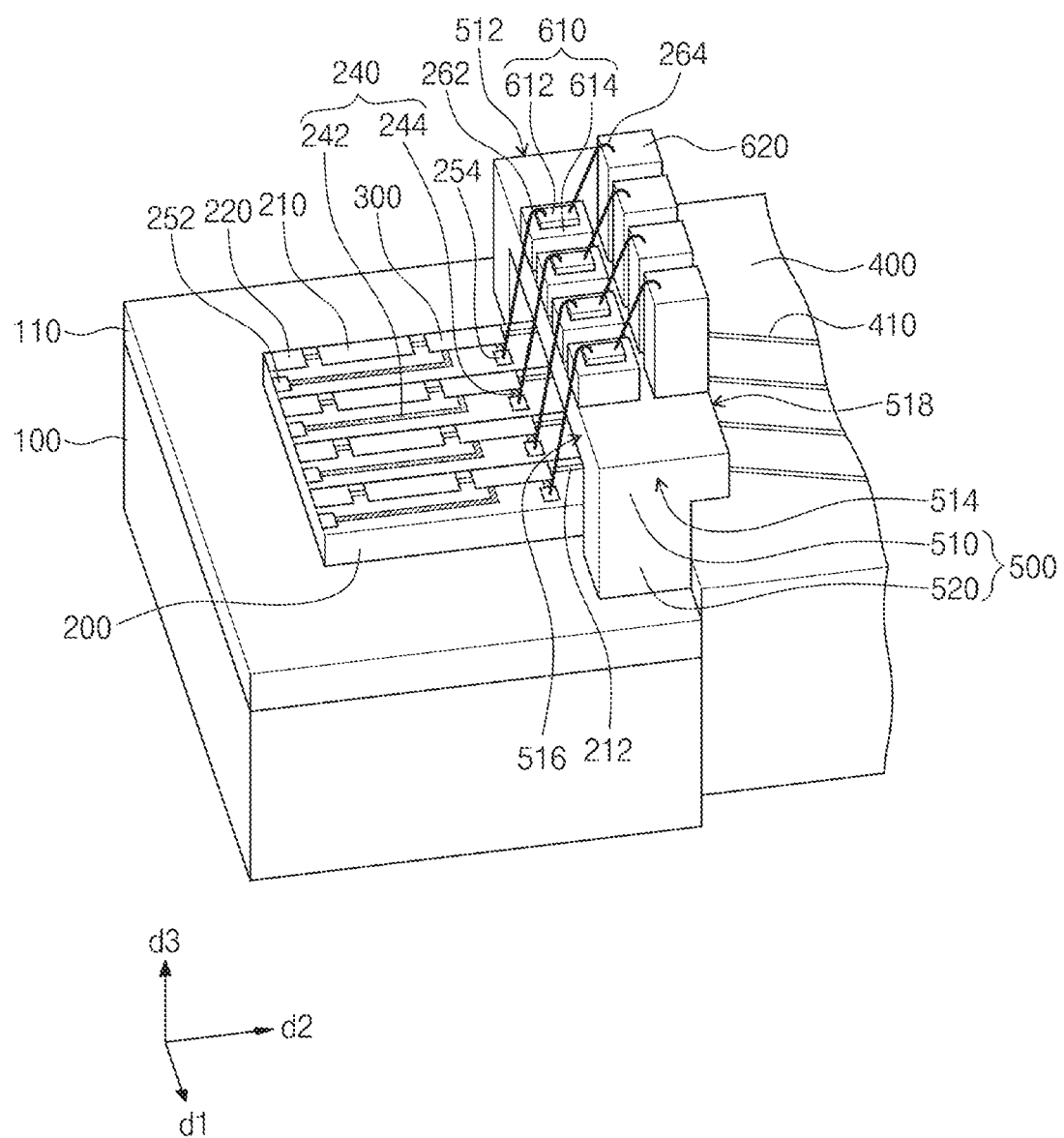
FIG. 1 is a perspective view of an optical transmitter module according to exemplary embodiments of the inventive concept.

Exemplary embodiments of technical ideas of the inventive concept will be described with reference to the accompanying drawings so as to sufficiently understand constitutions and effects of the inventive concept. The technical ideas of the inventive concept may, however, be embodied in different forms and should not be construed as limited to the embodiments set forth herein. Rather, these embodiments are provided so that this disclosure will be thorough and complete, and will fully convey the ideas of the inventive concept to those skilled in the art. Further, the present disclosure is only defined by scopes of claims.

Like reference numerals refer to like elements throughout. The embodiments in the detailed description will be described with cross-sectional views and/or plan views as ideal exemplary views of the inventive concept. In the figures, the dimensions of regions are exaggerated for effective description of the technical contents. Areas exemplified in the drawings have general properties and are used to illustrate a specific shape of a device. Thus, this should not be construed as limited to the scope of the inventive concept. Also, although various terms are used to describe various components in various embodiments of the inventive concept, the component are not limited to these terms. These terms are only used to distinguish one component from another component. Embodiments described and exemplified herein include complementary embodiments thereof.

In the following description, the technical terms are used only for explaining a specific exemplary embodiment while not limiting the inventive concept. In this specification, the terms of a singular form may include plural forms unless specifically mentioned. The meaning of 'comprises' and/or 'comprising' does not exclude other components besides a mentioned component.

Hereinafter, the present disclosure will be described in detail by explaining preferred embodiments of the technical ideas of the inventive concept with reference to the attached drawings.

Figure 2:
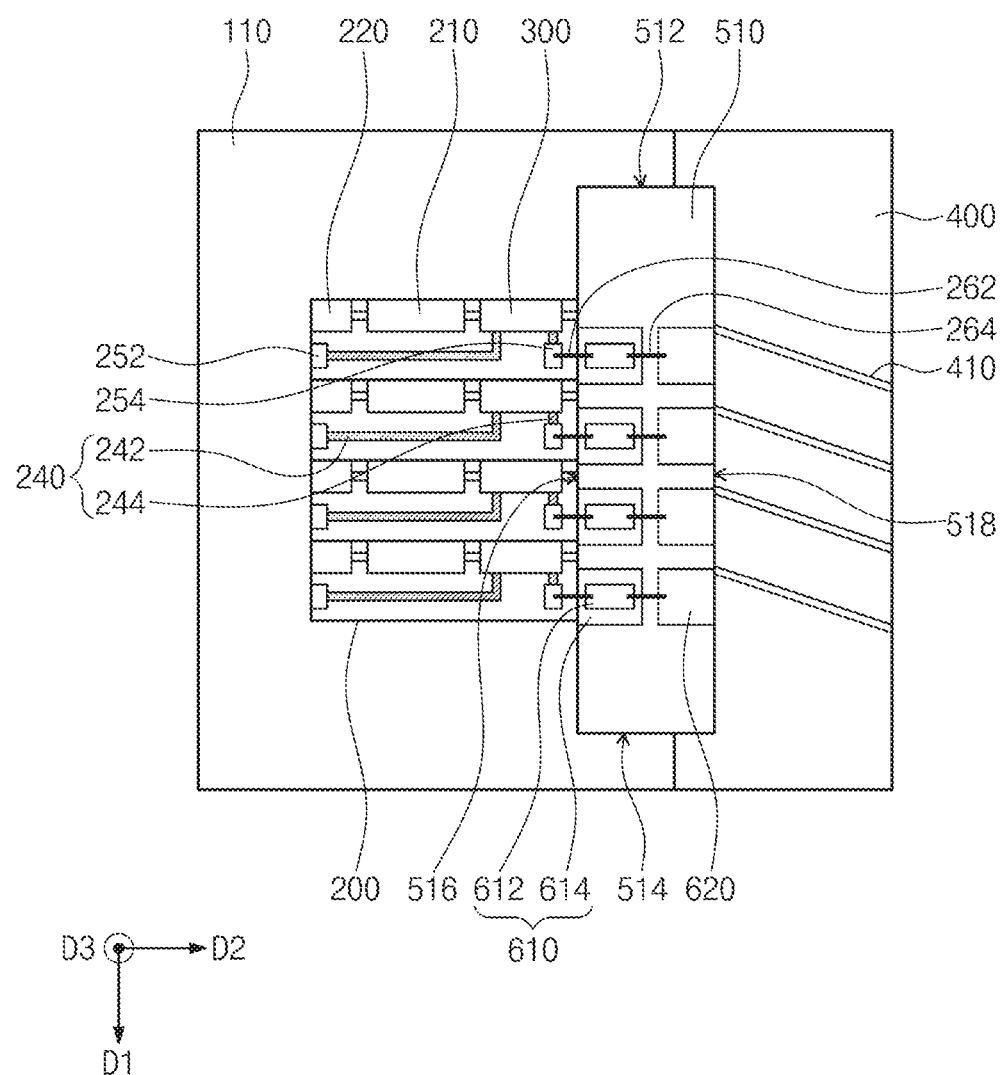
FIG. 2 is a top view of FIG. 1.
Figure 3:
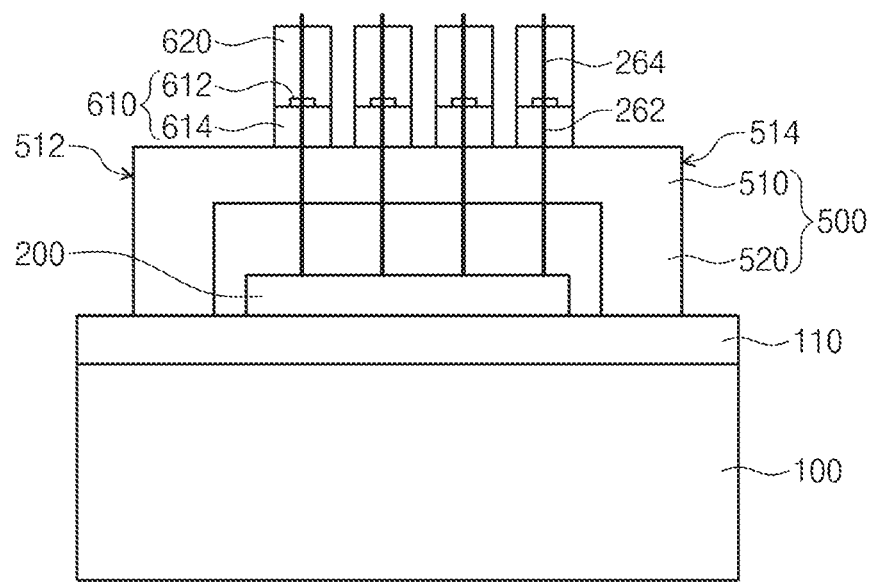
FIG. 3 is a front view of FIG. 1.
Figure 3:
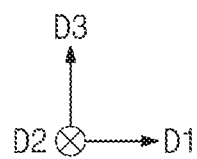
Figure 4:
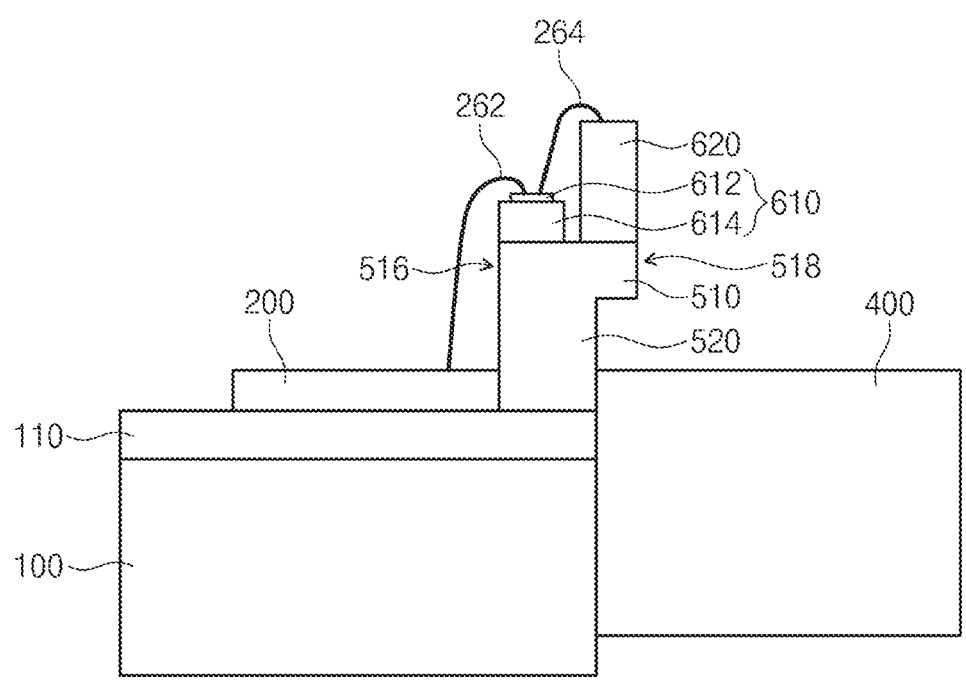
FIG. 4 is a side view of FIG. 1.
Figure 4:
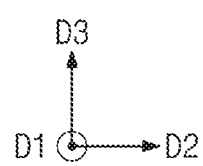

FIG. 1 is a perspective view of an optical transmitter module according to exemplary embodiments of the inventive concept. FIG. 2 is a top view of FIG. 1. FIG. 3 is a front view of FIG. 1. FIG. 4 is a side view of FIG. 1.

Referring to FIGS. 1 to 4, a substrate 100 may be provided. The substrate 100 may include a material having high thermal conductivity. For example, the substrate 100 may include silicon (Si) or aluminum nitride (AlN). Thus, heat generated from elements provided on the substrate 100 may be effectively dissipated through the substrate 100.

A ground layer 110 may be disposed on the substrate 100. The ground layer 110 may include a conductive material. For example, the ground layer 110 may include a metal. For example, the ground layer 110 may have a multi-layer structure of Cr/Ni/Au or a multi-layer structure of Ti/Pt/Au.

An electro-absorption modulated laser (hereinafter, referred to as an EML) chip 200 may be disposed on the ground layer 110. For example, the EML chip 200 may be bonded to a top surface of the ground layer 110. For example, the EML chip 200 may be bonded to the top surface of the ground layer 110 by using silver paste, AgSnCu solder paste, AuSn solder, or a combination thereof. The EML chip 200 may include a light source 210, a monitor photodiode 220, an electro-absorption modulator (hereinafter, referred to as an EAM) 300, a high-frequency transmission line 240, an input terminal electrode 252, and an output terminal electrode 254. The light source 210, the monitor photodiode 220, the EAM 300, the high-frequency transmission line 240, the input terminal electrode 252, and the output terminal electrode 254 may define one channel.

The light source 210 may generate a continuous wave (CW) to provide the generated CW to the EAM 300. For example, the light source 200 may include a laser diode (LD) or a distributed feedback laser diode (DFB-LD). In the exemplary embodiments, the light source 210 may include an asymmetrical diffraction grating.

The monitor photodiode 220 may monitor the light generated from the light source 210. A waveguide may be provided between the light source 210 and the monitor photodiode 220.

The EAM 300 may modulate the light transmitted from the light source 210 into an optical modulated signal by using a high-frequency voltage signal. For example, the high-frequency voltage signal may include a radio frequency voltage signal. The EAM 300 may include a material including a bulk, a multiple quantum wall, or a superlattice. The EAM 300 may have a light absorption coefficient that varies according to the high-frequency voltage signal applied from the EAM 300. For example, when a reverse voltage bias is applied to the EAM 300, the EAM 300 may increase in light absorption rate. Thus, the EAM 300 may block light. On the other hand, when the voltage bias is not applied to the EAM 300, a light absorption phenomenon of the EAM 300 may not occur. Thus, the EAM 300 may transmit light therethrough. As a result, the light provided from the light source 210 may be modulated to a high-frequency optical signal. The EAM 300 may be connected to the light source 210 through the waveguide. The EAM 300 may include a modulation electrode (not shown) thereon. In the exemplary embodiments, the EAM 300 may have a traveling-wave electrode structure. The traveling-wave electrode structure may be a structure through which the high-frequency voltage signal passes while traveling through the modulation electrode of the EAM 300. That is, the EAM 300 may include the traveling-wave electrode through which the high-frequency signal is inputted and outputted.

The high-frequency transmission line 240 may transmit the high-frequency voltage signal inputted into the EAM 300 and the high-frequency voltage signal outputted from the EAM 300. The high-frequency transmission line 240 may include a first high-frequency transmission line 242 disposed between the input terminal electrode 252 and the modulation electrode of the EAM 300. The first high-frequency transmission line 242 may receive the high-frequency signal from a high-frequency transmission line (not shown) that is disposed outside the EML chip 200 through the input terminal electrode 252 to provide the received high-frequency signal to the EAM 300. The first high-frequency transmission line 242 may have one end electrically connected to the modulation electrode of the EAM 300 and the other end electrically connected to the input terminal electrode 252. In the exemplary embodiments, the input terminal electrode 252 may include a ground-signal-ground (GSG) electrode. The GSG electrode may include a pair of ground pads (not shown) and one signal pad (not shown). In general, the pair of ground pads may be electrically connected to the ground layer below the EML chip 200 through a via (not shown), and the signal pad may be electrically connected to a main transmission line (e.g., the high-frequency transmission line 240 according to the inventive concept). Thus, when the input terminal electrode 252 includes the GSG electrode, the first high-frequency transmission line 242 may have the other end electrically connected to a signal terminal of the input terminal electrode 252. The first high-frequency transmission line 242 may include a traveling-wave microstrip line (MSL).

The high-frequency transmission line 240 may include a second high-frequency transmission line 244 disposed between the modulation electrode of the EAM 300 and the output terminal electrode 254. For example, in a viewpoint of a plane, the second high-frequency transmission line 244 may be disposed perpendicular to the modulation electrode of the EAM 300. The modulation electrode of the EAM 300 may extend in a second direction d2, and the second high-frequency transmission line 244 may extend in a first direction d1 crossing the second direction d2. The second high-frequency transmission line 244 may transmit the high-frequency voltage signal outputted from the EAM 300 through the output terminal electrode 254 to a matching resistor that will be described below. The second high-frequency transmission line 244 may have one end electrically connected to the modulation electrode of the EAM 300 and the other end electrically connected to the output terminal electrode 254. The first and second high-frequency transmission lines 242 and 244 may be electrically connected to different portions of the EAM 300. In the exemplary embodiments, the output terminal electrode 254 may include a ground-signal-ground (GSG) electrode. Thus, when the output terminal electrode 254 includes the GSG electrode, the second high-frequency transmission line 244 may have the other end electrically connected to a signal terminal of the output terminal electrode 254. The second high-frequency transmission line 244 may include a traveling-wave MSL. In the exemplary embodiments, the first and second high-frequency transmission lines 242 and 244 and the modulation electrode of the EAM 300 may define one high-frequency transmission line. That is, the high-frequency transmission line may include the first high-frequency transmission line 242, the modulation electrode of the EAM 300, and the second high-frequency transmission line 244.

A planar lightwave circuit chip (PLC) 400 may be disposed on a sidewall of the substrate 100. The PLC 400 may be disposed parallel to the substrate 100. The PLC 400 may include a waveguide 410 therein. In the exemplary embodiments, the waveguide 410 may be a PLC waveguide. The PLC 400 and the substrate 100 may be bonded to each other. For example, UV epoxy may be provided between a sidewall of the PLC 400 and a sidewall of the substrate facing the PLC 400 to bond the PLC 400 to the substrate 100. The PLC 400 may be disposed adjacent to the EML chip 200. The waveguide 410 may be disposed on an optical path of light provided from the EML chip 200 to receive an optical signal outputted from the EML chip 200. The PLC 400 may have a top surface that is disposed at substantially the same level as a top surface of the EML chip 200. The PLC 400 may include a dielectric material. For example, the PLC 400 may include InP, polymer, silica, silicon, or a combination thereof. In the exemplary embodiments, a spot-size or mode converter may be disposed between the EAM 300 and the waveguide 410. Optical coupling efficiency between the EAM 300 and the waveguide 410 may be maximized through the spot-size or mode converter.

A ground structure 500 may be disposed on the substrate 100. The ground structure 500 may be electrically connected to the ground layer 110. The ground structure 500 may include a ground plate 510 spaced apart from the ground layer 110 and a pair of supports 520 disposed between the ground plate 510 and the ground layer 110.

The ground plate 510 may be substantially parallel to the substrate 100. The ground plate 510 may have a width in the first direction d1. The width of the ground plate 510 in the first direction d1 may be greater than that of the EML chip 200 in the first direction d1. The ground plate 510 may have a first end 512 and a second end 514, which face each other in the first direction d1. In the viewpoint of the plane, the EML chip 200 may be disposed between the first and second ends 512 and 514 of the ground plate 510. That is, the first and second ends 512 and 514 of the ground plate 510 may not vertically overlap the EML chip 200.

The ground plate 510 may have a third end 516 and a fourth end 518, which are parallel to the top surface of the substrate 100 and face each other in the second direction d2 crossing the first direction d1. The third end 516 of the ground plate 510 may vertically overlap the substrate 100. The fourth end 518 of the ground plate 510 may vertically overlap the PLC 400. In the viewpoint of the plane, the fourth end 518 of the ground plate 510 may be spaced apart from the substrate 100 in the second direction d2. That is, the fourth end 518 of the ground plate 510 may not vertically overlap the EML chip 200.

The ground plate 510 may be disposed on the EML chip 200. The ground plate 510 may be spaced apart from the EML chip 200 in a direction perpendicular to the top surface of the substrate 100. In the viewpoint of the plane, the ground plate 510 may be spaced apart from the EAM 300 in the second direction d2. That is, in the exemplary embodiments, the ground plate 510 may not vertically overlap the EAM 300. However, in other exemplary embodiments, the ground plate 510 may vertically overlap the EAM 300. In the viewpoint of the plane, the ground plate 510 may be spaced apart from the output terminal electrode 254 in the second direction d2. That is, the ground plate 510 may not vertically overlap the output terminal electrode 254. The ground plate 510 may include a conductive material. For example, the ground plate 510 may include a metal. For example, the ground plate 510 may include Cu, W, CuW, SUS, or a combination thereof. The ground plate 510 may be electrically connected to the ground layer 110.

In the exemplary embodiments, a surface of the ground plate 510 may be coated with a metal. For example, a Cr/Au coating layer, a Cr/Ni/Au coating layer, a Ni/Pd/Au coating layer, or a Ti/Pt/Au coating layer may be disposed on the surface of the ground plate 510. Here, an Au layer may be disposed on the outermost portion of each of the coating layers.

The pair of supports 520 may be disposed between the ground plate 510 and the ground layer 110 to support the ground plate 510. For example, the pair of supports 520 may be disposed between the first end 512 of the ground plate 510 and the ground layer 110 and between the second end 514 of the ground plate 510 and the ground layer 110. Each of the pair of supports 520 may have a width in the second direction d2. The width of each of the pair of supports 520 in the second direction d2 may be less than that of the ground plate 510 in the second direction d2. In the viewpoint of the plane, the fourth end 518 of the ground plate 510 may be spaced apart from each of the pair of supports 520 in the second direction d2. That is, each of the pair of supports 520 may not vertically overlap the fourth end 518 of the ground plate 510. In the viewpoint of the plane, the PLC 400 may be spaced apart from the pair of supports 520 in the second direction d2. That is, each of the pair of supports 520 may not vertically overlap the PLC 400. Each of the pair of supports 520 may be horizontally spaced apart from the EML chip 200. For example, the EML chip 200 may be disposed between the pair of supports 520. Each of the pair of supports 520 may extend in a third direction d3 perpendicular to the top surface of the substrate 100.

Each of the pair of supports 520 may include a conductive material. For example, each of the pair of supports 520 may include a metal. For example, each of the pair of supports 520 may include Cu, W, CuW, SUS, or a combination thereof. The pair of supports 520 may be electrically connected to the ground plate 510 and the ground layer 110. In the exemplary embodiments, the ground plate 510 and the pair of supports 520 may be provided as a single structure. For example, the ground plate 510 and each of the pair of supports 520 may contact each other without having a boundary therebetween. That is, the pair of supports 520 may be extension parts that extend from the first and second ends 512 and 514 of the ground plate 510 to the ground layer 110. The ground plate 510 and the pair of supports 520 may be formed by processing one metal lump. In other exemplary embodiments, the pair of supports 520 may be bonded to the ground plate 510. That is, a boundary surface (not shown) may be defined between each of the pair of supports 520 and the ground plate 510.

In the exemplary embodiments, a surface of each of the pair of supports 520 may be coated with a metal. For example, a Cr/Au coating layer, a Cr/Ni/Au coating layer, a Ni/Pd/Au coating layer, or a Ti/Pt/Au coating layer may be disposed on the surface of each of the pair of supports 520. Here, an Au layer may be disposed on the outermost portion of each of the coating layers.

A matching resistor 610 and a capacitor 620 may be disposed on the ground structure 500. The matching resistor 610 may include a resistive film 612 and a ceramic block 614 disposed between the resistive film 612 and the ground plate 510. The matching resistor 610 may be a surface-mount device (SMD)-type resistor. To distinguish the resistive film 612 from other components, a thickness perpendicular to the top surface of the substrate 100 of the resistive film 612 is exaggeratedly expressed. In the exemplary embodiments, a pair of wire bonding pads (not shown) may be respectively disposed on both ends of the resistive film 612 in the second direction d2. Both ends of the resistive film 612 may be electrically connected to the pair of wire bonding pads, respectively. Each of the pair of wire bonding pads may include a conductive material. For example, each of the pair of wire bonding pads may include Au. In the exemplary embodiments, the resistor may include NiCr or TaN. The resistive film 612 may impedance-match the high-frequency transmission line 240. The resistive film 612 may have resistance of about 50Ω.

The ceramic block 614 may space the resistive film 612 from the ground plate 510. Thus, the resistive film 612 and the ground plate 510 may not be electrically connected to each other. However, the resistive film 612 may be electrically connected to the ground plate 510 through a bonding wire 264 that will be described below and the capacitor 620. For example, the ceramic block 614 may include silicon (Si), aluminum oxide (e.g., $Al_2O_3$), aluminum nitride (e.g., AlN), or a combination thereof. An adhesion material (not shown) may be provided between the ceramic block 614 and the ground plate 510 to bond the ceramic block 614 to the ground plate 510. For example, the adhesion material may be silver paste, AgSnCu solder paste, AuSn solder, or a combination thereof.

A first bonding wire 262 may be disposed between the EML chip 200 and the resistive film 612. For example, the first bonding wire 262 may be disposed between the resistive film 612 and the output terminal electrode 254 to electrically connect the resistive film 612 to the output terminal electrode 254. The bonding wire 262 may have one end contacting the resistive film 612. For example, the one end of the first bonding wire 262 may contact one of the pair of wire bonding pads. The first bonding wire 262 may have the other end contacting the output terminal electrode 254. Thus, when the output terminal electrode 254 includes the GSG electrode, the first bonding wire 262 may have the other end electrically connected to the signal terminal of the output terminal electrode 254.

The capacitor 620 may be disposed on the ground plate 510. The capacitor 620 may be spaced apart from the matching resistor 610. The capacitor 620 may be SMD-type capacitor. The capacitor 620 may include a pair of electrodes (not shown) that are spaced apart from each other and a dielectric material (not shown) between the pair of electrodes. One of the pair of electrodes of the capacitor 620 may be electrically connected to the ground plate 510. For example, a conductive adhesion material (not shown) may be disposed between one of the pair of electrodes of the capacitor 620 and the ground plate 510 to bond the one of the pair of electrodes of the capacitor 620 to the ground plate 510. The conductive adhesion material may include silver paste, AgSnCu solder paste, AuSn solder, or a combination thereof. In the exemplary embodiments, the capacitor may have capacitance of about 0.1 µF.

Since the capacitor 620 is in an electrically opened state with respect to direct current, the capacitor 620 may block the direct current. Thus, only alternating current may flow through the resistive film 612 connected to the capacitor 620 in series. That is, the direct current may not flow through the resistive film 612. When the direct current flows through the resistive film 612, Joule's heat may be generated in the resistive film 612. The Joule's heat generated in the resistive film 612 may degrade optical output characteristics and wavelength stability of the EML chip. In the optical transmitter module according to the inventive concept, since the direct current does not flow through the resistive film 612, the degradation of the optical output characteristics and the wavelength stability may be prevented.

The second bonding wire 264 may be disposed between the capacitor 620 and the resistive film 612 to electrically connect the capacitor 620 to the resistive film 612. For example, the second bonding wire 264 may be disposed between the rest of the pair of electrodes of the capacitor 620 and the resistive film 612 to electrically connect the rest of the pair of electrodes of the capacitor 620 to the resistive film 612. The second bonding wire 264 may have one end that directly contacts the rest of the pair of electrodes of the capacitor 620 and the other end that directly contacts the resistive film 612.

Hereinafter, a multi-channel optical transmitter module will be described. A multi-channel EML array chip 200 may be disposed on a ground layer 110. A 4-channel EML array chip is exemplarily illustrated. In other embodiments, the number of channels of the EML array chip may be greater or less than four. The channels of the multi-channel EML array chip 200 may be arranged in the first direction d1. Descriptions of each of the channels of the multi-channel EML array chip 200 may be substantially the same as those of the channel of the above-described EML chip 200. That is, each of the channels of the multi-channel EML array chip 200 may include a light source 210, a monitor photodiode 220, an EAM 300, a high-frequency transmission line 240, an input terminal electrode 252, and an output terminal electrode 254.

A ground structure 500 may be disposed on the multi-channel EML array chip 200. A width of the ground structure 500 in the first direction d1 may be greater than that of the multi-channel EML array chip 200 in the first direction d1. For example, in a viewpoint of a plane, first and second ends 512 and 514 of the ground plate 510 may be spaced apart from the multi-channel EML array chip 200 in the first direction d1. That is, the first and second ends 512 and 514 of the ground plate 510 may not vertically overlap the multi-channel EML array chip 200. A pair of supports 520 may be disposed between the first end 512 of the ground plate 510 and the ground layer 110 and between the second end 514 of the ground plate 510 and the ground layer 110.

A plurality of matching resistors 610 and a plurality of capacitors 620 may be disposed on the ground structure 500. For example, the plurality of matching resistors 610 and the plurality of capacitors 620 may be disposed on the ground plate 510. The number of the plurality of matching resistors 610 and the number of the plurality of capacitors 620 may be the same as that of channels of the multi-channel EML array chip 200. Although four matching resistors 610 and four capacitors 620 are illustrated, this may be mere an example. That is, in other embodiments, more or less than four matching resistors 610 and more or less than four capacitors 620 may be disposed on the ground structure 500.

Each of the plurality of matching resistors 610 may include a resistive film 612 and a ceramic block 614 disposed between the resistive film 612 and the ground plate 510. The channels of the multi-channel EML array chip 200 and the plurality of matching resistors 612 may be electrically connected to each other, respectively. Each of the plurality of matching resistors 612 and each of the plurality of capacitors 620 may be electrically connected to each other. The plurality of capacitors 620 may be electrically connected to the ground plate 510.

A plurality of first bonding wires 262 may be disposed between the channels of the multi-channel EML array chip 200 and the plurality of matching resistors 612 to electrically connect the channels of the multi-channel EML array chip 200 to the plurality of matching resistors 612. The plurality of first bonding wires 262 may have substantially the same length.

A plurality of second bonding wires 264 may be disposed between the plurality of matching resistors 612 and the plurality of capacitors 620 to electrically connect the plurality of matching resistors 612 to the plurality of capacitors 620. The plurality of second bonding wires 264 may have substantially the same length.

In general, when the multi-channel EML array chip 200 and the plurality of matching resistors 612 are arranged (2-dimensionally arranged) in a direction parallel to a top surface of a substrate 100, the plurality of bonding wires 262 disposed between the channels of the multi-channel EML array chip 200 and the plurality of matching resistors 612 may have lengths different from each other. For example, when the 4-channel EML array chip 200 and the plurality of matching resistors 612 are arranged in the direction parallel to the top surface of the substrate 100, each of the first bonding wires 262 electrically connected to the two inner channels of the channels of the multi-channel EML array chip 200 may have a length greater than that of each of the first boding wires 262 electrically connected to the two outer channels. When the first bonding wires 262 have lengths different from each other, it may be difficult to achieve the uniform high-frequency characteristic. That is, the channels of the optical transmitter module may have high-frequency characteristics different from each other.

The channels of the multi-channel EML array chip 200 and the plurality of matching resistors 612 according to the inventive concept may be arranged (3-dimensionally arranged) in a direction perpendicular to the top surface of the substrate 100. Since vertical distances between the plurality of matching resistors 612 and the channels of the multi-channel EML array chip 200 are the same, the plurality of first bonding wires 262 may have substantially the same length. Thus, the multi-channel optical transmitter module having the uniform high-frequency characteristic may be provided.

In general, when the EAM 300 has a lump electrode structure, the bonding wire may be provided between the high-frequency transmission line outside the EML chip 200 and the EAM 300. The more the number of channel of the EML chip 200 increases, the more the bonding wire increases in length. When the bonding wire has a long length, it may be difficult to achieve wideband modulation bandwidth characteristics. Particularly, when the bonding wire has a length greater than 700 µm, the high-frequency characteristics of the optical transmitter module may be deteriorated.

Since the EAM 300 according to the inventive concept has a traveling-wave electrode structure, a bonding wire (not shown) may be provided between the high-frequency transmission line outside the EML chip 200 and the input terminal electrode 252. Since the input terminal electrode 252 is disposed on an end of the EML chip 200, the bonding wire may be controlled to have a required length. For example, the bonding wire may be controlled to have a length of 300 µm or less. The bonding wire may be controlled to have a short length to easily achieve the wideband modulation bandwidth characteristics and maintain the high-frequency characteristics of the optical transmitter module.

The first and second bonding wires 262 and 264 may be adjusted in length. For example, a height of a top surface of the ground plate 510 and a thickness of the ceramic block 614 of the matching resistor 610 may be adjusted to adjust each of the lengths of the first and second bonding wires 262 and 264. Since each of the first and second bonding wires 262 and 264 has an inductance, the first and second bonding wires 262 and 264 may be adjusted in length to easily change a modulation bandwidth of the EAM 300.

In general, when the matching resistor and the capacitor are disposed around the EML chip through an integrated ceramic sub-mount, since the ceramic sub-mount is expensive, the optical transmitter module may increase in manufacturing cost. Since the resistive film 612 and the capacitor 620 according to the inventive concept are SMD-type devices that are relatively inexpensive, the optical transmitter module may be reduced in manufacturing cost.

Figure 5:
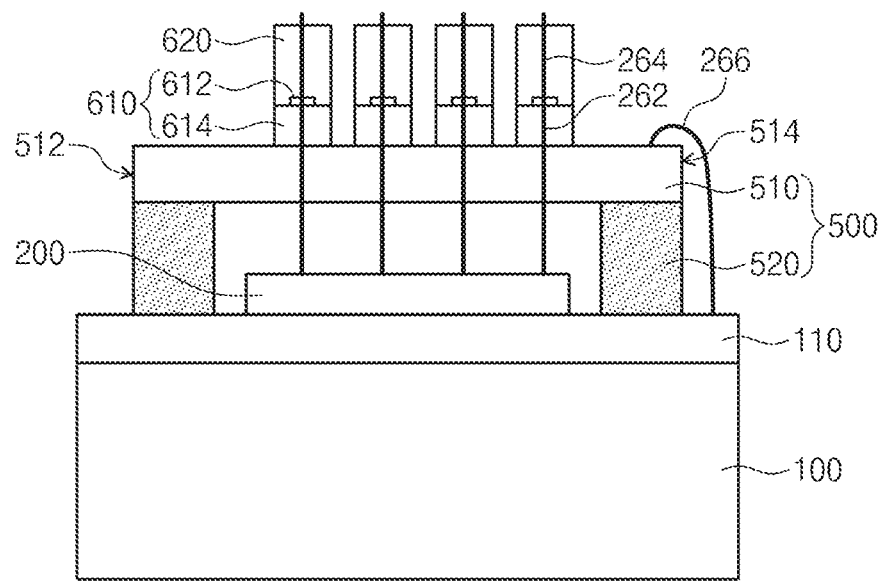
FIG. 5 is a front view of an optical transmitter module corresponding to that of FIG. 3 according to exemplary embodiments of the inventive concept.
Figure 5:
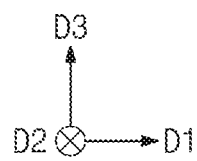
Figure 6:
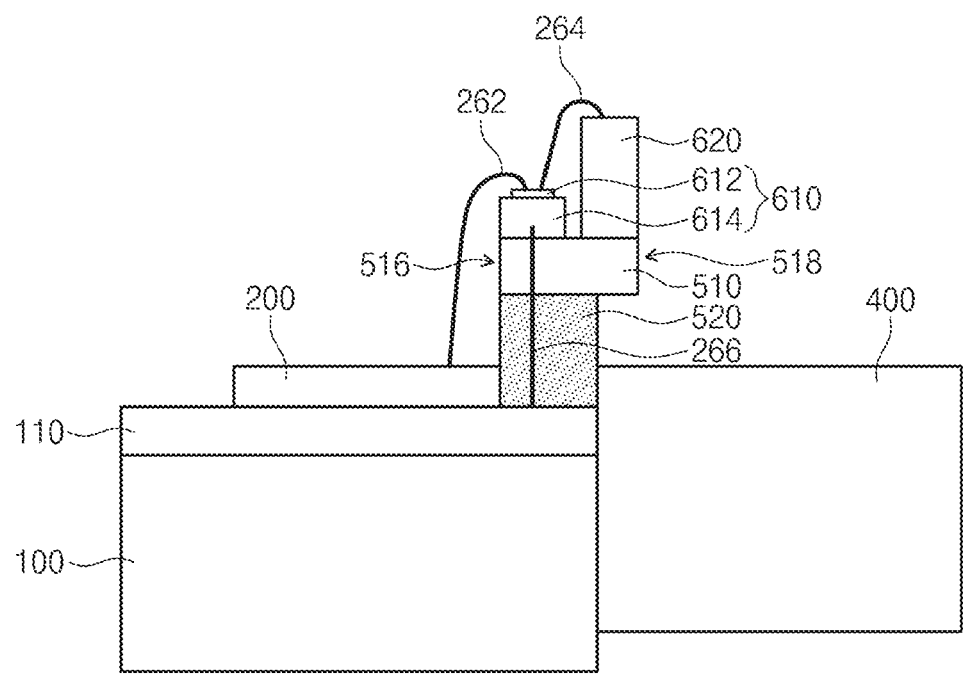
FIG. 6 is a side view of an optical transmitter module corresponding to that of FIG. 4 according to exemplary embodiments of the inventive concept.
Figure 6:
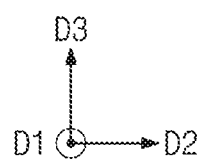

FIG. 5 is a front view of an optical transmitter module corresponding to that of FIG. 3 according to exemplary embodiments of the inventive concept. FIG. 6 is a side view of an optical transmitter module corresponding to that of FIG. 4 according to exemplary embodiments of the inventive concept. For briefness of descriptions, substantially the same description as those described with reference to FIGS. 1 to 4 will be omitted.

Referring to FIGS. 5 and 6, a substrate 100, a ground layer 110 disposed on the substrate 100, an EML chip 200 disposed on the ground layer 110, and a PLC 400 disposed on a side surface of the substrate 100 may be provided. The substrate 100, the ground layer 110, the EML chip 200, and the PLC 400 may be substantially the same as those of FIGS. 1 and 2.

A ground structure 500 may be disposed on the ground layer 110. The ground structure 500 may include a ground plate 510 spaced apart from the substrate 100 and a pair of supports 520 disposed between the ground plate 510 and the substrate 100. The ground plate 510 may be substantially the same as the ground plate 510 described with reference to FIGS. 1 to 4.

The pair of supports 520 may be substantially the same as the pair of supports 520 that are described with reference to FIGS. 1 and 2 except for a material contained in the pair of supports 520. Unlike the pair of supports 520 described with reference to FIGS. 1 and 2, the pair of supports 520 may include a dielectric material. For example, the pair of supports 520 may include silicon (Si), aluminum oxide (e.g., $Al_2O_3$), aluminum nitride (e.g., AlN), or a combination thereof. An adhesion material may be provided between the ground plate 510 and the pair of supports 520 to bond the ground plate 510 to the pair of supports 520. For example, the adhesion material may include silver paste, AgSnCu solder paste, AuSn solder, or a combination thereof.

First and second bonding wires 262 and 264, a matching resistor 610, and a capacitor 620 may be disposed on the ground plate 510. The first and second bonding wires 262 and 264, the matching resistor 610, and the capacitor 620 may be substantially the same as the first and second bonding wires 262 and 264, the matching resistor 610 and the capacitor 620, which are described with reference to FIGS. 1 and 2. A third bonding wire 266 may be disposed between the ground plate 510 and the ground layer 110. The third bonding wire 266 may electrically connect the ground plate 510 to the ground layer 110. The third bonding wire 266 may have one end contacting the ground plate 510 and the other end contacting the ground layer 110.

Figure 7:
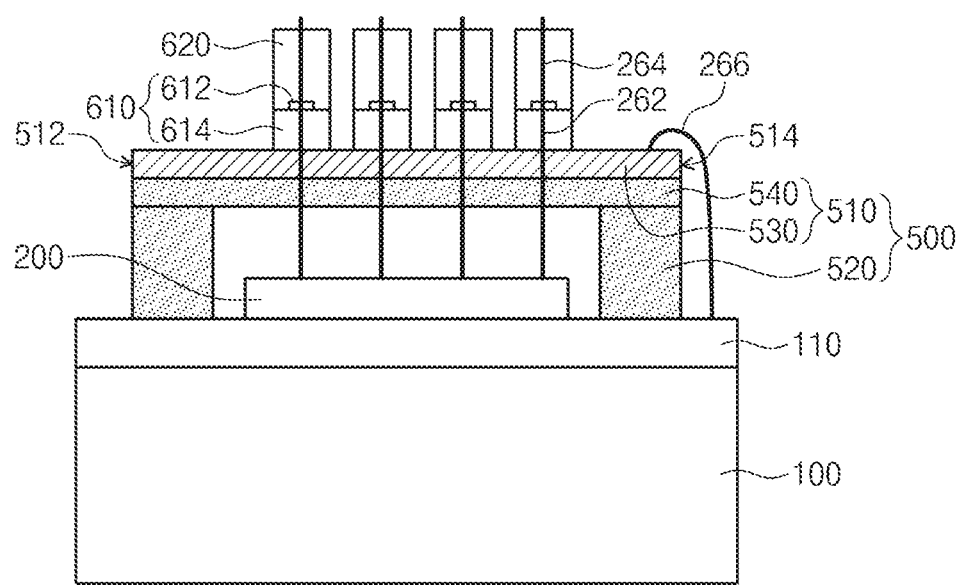
FIG. 7 is a front view of an optical transmitter module corresponding to that of FIG. 3 according to exemplary embodiments of the inventive concept.
Figure 7:
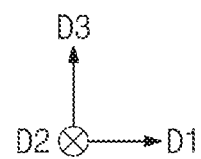
Figure 8:
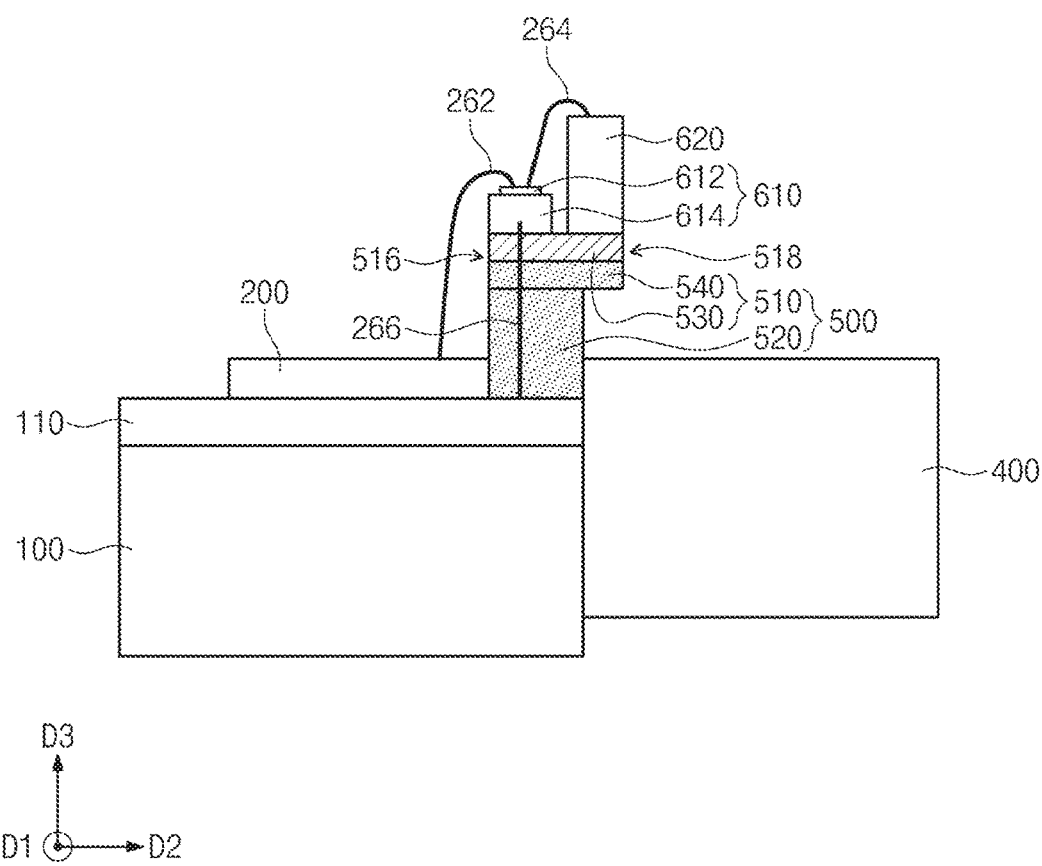
FIG. 8 is a side view of an optical transmitter module corresponding to that of FIG. 4 according to exemplary embodiments of the inventive concept.

FIG. 7 is a front view of an optical transmitter module corresponding to that of FIG. 3 according to exemplary embodiments of the inventive concept. FIG. 8 is a side view of an optical transmitter module corresponding to that of FIG. 4 according to exemplary embodiments of the inventive concept. For briefness of descriptions, substantially the same description as those described with reference to FIGS. 1 to 3 will be omitted.

Referring to FIGS. 7 and 8, a substrate 100, a ground layer 110 disposed on the substrate 100, an EML chip 200 disposed on the ground layer 110, and a PLC 400 disposed on a side surface of the substrate 100 may be provided. The substrate 100, the ground layer 110, the EML chip 200, and the PLC 400 may be substantially the same as those of FIGS. 1 and 4.

A ground structure 500 may be disposed on the ground layer 110. The ground structure 500 may include a ground plate 510 spaced apart from the substrate 100 and a pair of supports 520 disposed between the ground plate 510 and the substrate 100. The ground plate 510 may be substantially the same as the ground plate 510 described with reference to FIGS. 1 and 2 except for a conductive layer 530 and a dielectric layer 540 disposed between the conductive layer 530 and the pair of supports 520. The dielectric layer 540 may include silicon (Si), aluminum oxide (e.g., $Al_2O_3$), aluminum nitride (e.g., AlN), or a combination thereof. The conductive layer 530 may include a metal. For example, the conductive layer 530 may include a Cr/Au layer, a Cr/Ni/Au layer, a Ti/Pt/Au layer, or a Ti/Pt/Au layer. The uppermost layer of the conductive layer 530 may be an Au layer.

The pair of supports 520 may be substantially the same as the pair of supports 520 that are described with reference to FIGS. 1 and 2 except for a material contained in the pair of supports 520. Unlike the pair of supports 520 described with reference to FIGS. 1 and 2, the pair of supports 520 may include a dielectric material. For example, the pair of supports 520 may include silicon (Si), aluminum oxide (e.g., $Al_2O_3$), aluminum nitride (e.g., AlN), or a combination thereof. An adhesion material may be provided between the dielectric film 540 and the pair of supports 520 to bond the dielectric film 540 to the pair of supports 520. For example, the adhesion material may include silver paste, AgSnCu solder paste, AuSn solder, or a combination thereof.

First and second bonding wires 262 and 264, a matching resistor 610, and a capacitor 620 may be disposed on the conductive layer 530. The first and second bonding wires 262 and 264, the matching resistor 610, and the capacitor 620 may be substantially the same as the first and second bonding wires 262 and 264, the matching resistor 610 and the capacitor 620, which are described with reference to FIGS. 1 and 2. A third bonding wire 266 may be disposed on the conductive layer 530. The third bonding wire 266 may be disposed between the conductive layer 530 and the ground layer 110. The third bonding wire 266 may electrically connect the conductive layer 530 to the ground layer 110. The third bonding wire 266 may have one end contacting the conductive layer 530 and the other end contacting the ground layer 110.

According to the inventive concept, each of the first bonding wire between the high-frequency transmission line and the matching resistor and the second bonding wire between the matching resistor and the capacitor may be adjusted in length to improve the high-frequency characteristics. The plurality of first bonding wires having the same length and the plurality of second bonding wires having the same length may be provided to realize the uniform high-frequency characteristic of the multi-channel optical transmitter module. The SMD-type matching resistor and the SMD-type capacitor may be used to reduce the manufacturing costs of the optical transmitter module.

However, the effects of the inventive concept are not limited to the above-described descriptions.

The above-described descriptions according to the embodiments of the inventive concept are exemplarily provided for explaining the inventive concept. Thus, it is understood that the present invention should not be limited to these exemplary embodiments but various changes and modifications can be made by one ordinary skilled in the art within the spirit and scope of the present invention as hereinafter claimed.

What is claimed is:

1. An optical transmitter module comprising:
    a substrate;
    a ground layer disposed on the substrate;
    an electro-absorption modulated laser (EML) chip disposed on the ground layer to generate an optical signal;
    a ground structure disposed on the EML chip and electrically connected to the ground layer;
    a matching resistor disposed on the ground structure; and
    a first bonding wire disposed between the EML chip and the matching resistor to electrically connect the EML chip to the matching resistor,
    wherein the ground structure comprises:
    a ground plate spaced apart from the EML chip and including a metal; and
    a pair of supports disposed between the ground plate and the ground layer and being in direct contact with the ground layer.

2. The optical transmitter module of claim 1, further comprising:
    a capacitor disposed on the ground structure and electrically connected to the ground structure; and
    a second bonding wire disposed between the capacitor and the matching resistor to electrically connect the capacitor to the matching resistor,
    wherein the capacitor blocks a direct current flowing through the matching resistor.

3. The optical transmitter module of claim 2, wherein the ground plate is electrically connected to the ground layer.

4. The optical transmitter module of claim 3, wherein the ground plate comprises first and second ends, which face each other in a first direction parallel to a top surface of the substrate,
    in a viewpoint of a plane, the EML chip is disposed between the first and second ends of the ground plate, and
    the pair of supports are respectively disposed between the first end of the ground plate and the ground layer and between the second end of the ground plate and the ground layer.

5. The optical transmitter module of claim 4, further comprising a planar lightwave circuit chip (PLC) disposed parallel to the substrate,
    wherein the ground plate comprises third and fourth ends, which are parallel to the top surface of the substrate and face each other in a second direction crossing the first direction,
    the third end of the ground plate vertically overlaps the substrate, and
    the fourth end of the ground plate vertically overlaps the PLC.

6. The optical transmitter module of claim 5, wherein, in the viewpoint of the plane, the fourth end protrudes from each of the pair of supports in the second direction.

7. The optical transmitter module of claim 3, wherein the ground plate comprises Cu, W, CuW, SUS, or a combination thereof, and
    a surface of the ground plate is coated with Cr/Au, Cr/Ni/Au, Ni/Pd/Au, or Ti/Pt/Au.

8. The optical transmitter module of claim 3, wherein the ground plate comprises a conductive layer and a dielectric layer disposed between the conductive layer and the pair of supports, and
    the conductive layer is electrically connected to the ground layer.

9. The optical transmitter module of claim 8, further comprising a third bonding wire disposed between the conductive layer and the ground layer to electrically connect the conductive layer to the ground layer.

10. The optical transmitter module of claim 3, wherein each of the pair of supports comprises a conductive material, and
    the ground plate and the ground layer are electrically connected to each other through the pair of supports.

11. The optical transmitter module of claim 3, further comprising a third bonding wire disposed between the ground plate and the ground layer to electrically connect the ground plate to the ground layer, and
    wherein each of the pair of supports comprises a dielectric material.

12. The optical transmitter module of claim 2, wherein the matching resistor and the capacitor are a surface-mount device (SMD)-type resistor and an SMD-type capacitor, respectively.

13. The optical transmitter module of claim 2, wherein the EML chip comprises:
    a light source configured to generate continuous wave (CW) light;
    an electro-absorption modulator (EAM) configured to receive the CW light from the light source and generate the modulated optical signal;
    a high-frequency transmission line configured to transmit a high-frequency signal inputted into the EAM and a high-frequency signal outputted from the EAM; and
    input and output terminal electrodes respectively disposed on ends of the high-frequency transmission line,
    wherein, in a viewpoint of a plane, the ground plate is spaced apart from the output terminal electrode, and
    the matching resistor impedance-matches the high-frequency transmission line and the EAM.

14. The optical transmitter module of claim 2, wherein the high-frequency transmission line comprises:
    a first high-frequency transmission line disposed between the input terminal electrode and the EAM electrode; and
    a second high-frequency transmission line disposed between the EAM and the output terminal electrode,
    wherein each of the first and second high-frequency transmission lines comprises a traveling-wave microstrip line.

15. An optical transmitter module comprising:
a substrate;
a ground layer disposed on the substrate;
a multi-channel EML array chip disposed on the ground layer to generate an optical signal;
a ground structure disposed on the multi-channel EML array chip and electrically connected to the ground layer, the ground structure comprising a ground plate spaced apart from the multi-channel EML array chip and including a metal, and a pair of supports disposed between the ground plate and the ground layer and being in direct contact with the ground layer;
a plurality of matching resistors disposed on the ground structure;
a plurality of first bonding wires disposed between the multi-channel EML array chip and the plurality of matching resistors to electrically connect channels of the multi-channel EML array chip to the plurality of matching resistors, respectively;
a plurality of capacitors disposed on the ground structure and electrically connected to the ground structure; and
a plurality of second bonding wires disposed between the plurality of capacitors and the plurality of matching resistors to electrically connect the plurality of capacitors to the plurality of matching resistors, respectively.

16. The optical transmitter module of claim 15, wherein the plurality of first bonding wires have a same length.

17. The optical transmitter module of claim 15, wherein the plurality of second bonding wires have a same length.

* * * * *